United States Patent
Lei et al.

(10) Patent No.: US 10,686,016 B2
(45) Date of Patent: Jun. 16, 2020

(54) ORGANIC LIGHT EMITTING DISPLAY PANEL AND ORGANIC LIGHT EMITTING DISPLAY APPARATUS

(71) Applicants: SHANGHAI TIANMA AM-OLED CO., LTD., Shanghai (CN); TIANMA MICRO-ELECTRONICS CO., LTD., Shenzhen (CN)

(72) Inventors: Zhihong Lei, Shanghai (CN); Jinghua Niu, Shanghai (CN); Xiangcheng Wang, Shanghai (CN); Lei Lv, Shanghai (CN); Shuang Cheng, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 234 days.

(21) Appl. No.: 15/611,132

(22) Filed: Jun. 1, 2017

(65) Prior Publication Data

US 2017/0294490 A1  Oct. 12, 2017

(30) Foreign Application Priority Data

Dec. 27, 2016  (CN) .......................... 2016 1 1224122

(51) Int. Cl.
*H01L 51/52* (2006.01)
*H01L 27/32* (2006.01)

(52) U.S. Cl.
CPC ...... *H01L 27/3211* (2013.01); *H01L 51/5203* (2013.01); *H01L 51/5265* (2013.01);
(Continued)

(58) Field of Classification Search
CPC ... H01L 27/3241–3297; H01L 27/3246; H01L 51/00–56; H01L 51/5265
See application file for complete search history.

(56) References Cited

U.S. PATENT DOCUMENTS

2005/0285508 A1* 12/2005 Murayama .......... H01L 27/3211
    313/503
2006/0108919 A1*  5/2006 Kobayashi .......... H01L 27/3211
    313/506

(Continued)

FOREIGN PATENT DOCUMENTS

| CN | 102694131 A | 9/2012 |
|---|---|---|
| CN | 105552107 A | 5/2016 |
| CN | 105895664 A | 8/2016 |

*Primary Examiner* — Eric A. Ward
(74) *Attorney, Agent, or Firm* — Alston & Bird LLP

(57) ABSTRACT

An organic light emitting display panel and apparatus, and a manufacturing method therefor are provided. The organic light emitting display panel includes a plurality of light emitting units, the light emitting unit includes an anode, a first auxiliary functional structure, a light emitting structure and a cathode, the anode, the first auxiliary functional structure, the light emitting structure and the cathode are successively laminated, and the first auxiliary functional structures of different light emitting units are arranged separate from one another, the anodes of different light emitting units are arranged separate from one another, and the light emitting structures of different light emitting units are arranged separate from one another.

14 Claims, 4 Drawing Sheets

(52) U.S. Cl.
CPC ........ *H01L 51/5296* (2013.01); *H01L 27/322* (2013.01); *H01L 51/5218* (2013.01)

(56) References Cited

U.S. PATENT DOCUMENTS

| | | | | |
|---|---|---|---|---|
| 2006/0263628 | A1* | 11/2006 | Aziz | H01L 51/5206 428/690 |
| 2007/0102737 | A1* | 5/2007 | Kashiwabara | H01L 27/3211 257/291 |
| 2008/0284324 | A1* | 11/2008 | Chun | H01L 27/3211 313/504 |
| 2012/0025226 | A1* | 2/2012 | Oda | H01L 27/3211 257/89 |
| 2012/0164772 | A1* | 6/2012 | Lee | C23C 14/042 438/34 |
| 2013/0153883 | A1* | 6/2013 | Kurata | H01L 27/3211 257/40 |
| 2017/0346012 | A1* | 11/2017 | Koo | H01L 51/0061 |
| 2018/0219169 | A1* | 8/2018 | Jiang | H01L 51/5056 |
| 2019/0006602 | A1* | 1/2019 | Chun | C07D 487/14 |

* cited by examiner

ORGANIC LIGHT EMITTING DISPLAY PANEL AND ORGANIC LIGHT EMITTING DISPLAY APPARATUS

CROSS-REFERENCE TO RELATED APPLICATION

This application claims priority to a Chinese patent application No. CN201611224122.4 filed on Dec. 27, 2016, the disclosure of which is incorporated herein by reference in its entirety.

TECHNICAL FIELD

Embodiments of the present disclosure relate to an organic light emitting display technology, and in particular relate to an organic light emitting display panel and an organic light emitting display apparatus.

BACKGROUND

The organic light emitting display (OLED) has already become one of the key devices of the display industry, because of its various technical advantages such as requiring no backlight source, high contrast, slim thickness, wide viewing angle, high response speed and the like.

However, current structures of a conventional OLED involving various light emitting film layers in tend to induce transverse currents in the organic light emitting display panel when an image is displayed. Under the action of the transverse current, a signal crosstalk phenomenon will occurred between two adjacent light emitting units. When one light emitting unit emits light in a normal operation, a nearby light emitting unit which should not emit light may also emit under the influence of the transverse current, causing poor display.

SUMMARY

The present disclosure provides an organic light emitting display panel and apparatus, and a manufacturing method therefor, to avoid signal crosstalk phenomenon caused by a transverse current generated in the organic light emitting display panel, and ensure that the organic light emitting display panel can display correct images.

In a first aspect, embodiments of the present disclosure provide an organic light emitting display panel. The organic light emitting display panel includes a plurality of light emitting units. Each of the light emitting units comprises an anode, a first auxiliary functional structure, a light emitting structure and a cathode, the anode, the first auxiliary functional structure, the light emitting structure and the cathode are successively laminated. The first auxiliary functional structure s of different light emitting units are arranged separate from one another, the anodes of different light emitting units are arranged separate from one another and the light emitting structures of different light emitting units are arranged separate from one another.

In a second aspect, embodiments of the present disclosure further provide an organic light emitting display apparatus. The organic light emitting display apparatus includes any one of the organic light emitting display panels provided by embodiments of the present disclosure.

According to the embodiments of the present disclosure, the first auxiliary functional structures, the anodes and the light emitting structures of different light emitting units are defined as being arranged separate from one another, so that the problem that an existing organic light emitting display panel cannot display normally due to the signal crosstalk phenomenon caused by the transverse current generated in the organic light emitting display panel is solved, the transverse current is prevented from being generated in the organic light emitting display panel and the organic light emitting display panel is ensured to display the image normally.

DETAILED DESCRIPTION

Figure 1:
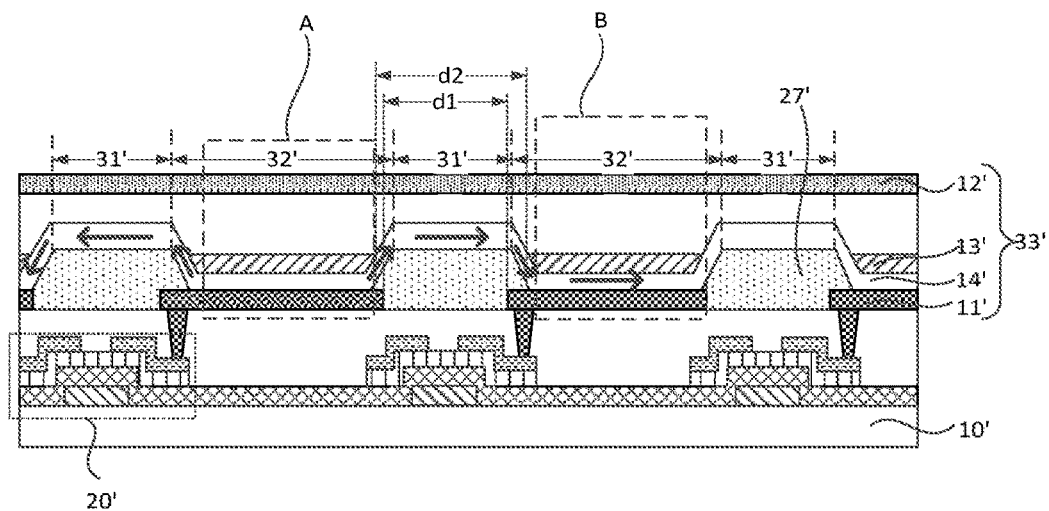
FIG. 1 illustrates a cross sectional structure of an existing organic light emitting display panel.

The present disclosure is further described below in detail in combination with drawings and embodiments. It may be understood that the specific embodiments described herein are only used for explaining the present disclosure rather than limiting the present disclosure. In addition, it should be stated that in order to facilitate the description, only a part related to the present disclosure rather than the whole structure is illustrated in the drawings.

FIG. 1 is a cross sectional structure illustrating a conventional organic light emitting display panel. Referring to FIG. 1, the organic light emitting display panel includes a substrate 10'. The substrate 10' is divided into a plurality of pixel regions 32' and non-pixel regions 31', and the pixel regions 32' and the non-pixel regions 31' are arranged alternately.

The non-pixel region 31' includes a thin-film transistor 20' formed on the substrate 10' and a pixel limiting structure 27' formed at a side, away from the substrate 10', of the thin-film transistor 20'. The pixel region 32' includes a plurality of light emitting units 33'. The light emitting unit 33' includes an anode 11', a cathode 12', a light emitting structure 13' formed between the anode 11' and the cathode 12', and a first auxiliary functional structure 14' formed between the anode 11' and the light emitting structure 13'. The anodes 11' of different light emitting units 33' are respectively arranged separate from one another and the light emitting structures 13' of different light emitting units 33' are arranged separate from one another, that is to say, the anodes 11' of different light emitting units 33' are separated from each other at a first set distance d1, and the light emitting structures 13' of different light emitting units 33' are separated from each other at a second set distance d2. However, the first auxiliary functional structures of different light emitting units 33' are directly connected to each other to form a film layer of an entire-surface structure. The cathode 12' in the light emitting unit 33' is electrically connected with the thin-film transistor 20'.

The organic light emitting display panel further includes a plurality of data lines and scan lines (not shown in FIG. 1). In FIG. 1, the organic light emitting display panel exemplarily includes two complete light emitting units 33', i.e. a first light emitting unit A and a second light emitting unit B. When an image is displayed, it is assumed that only the first light emitting unit A needs to emit the light at a moment, and the second light emitting unit B does not emit the light. An ideal working process is as follows: a drive signal is respectively provided to the cathode 12' and the scan lines by a drive circuit (not shown in FIG. 1) to activate the thin-film transistor 20' corresponding to the first light emitting unit A, so that the anode 11' of the first light emitting unit A can receive a drive signal provided by the data lines, and then the light emitting structure 13' corresponding to the first light emitting unit A is excited to emit the light. At the moment, the drive circuit provides the drive signal to the scan lines to control the thin-film transistor 20' corresponding to the second light emitting unit B to be closed, and the anode 11 corresponding to the second light emitting unit B cannot receive the drive signal provided by the data lines. The light emitting structure 13' corresponding to the second light emitting unit B does not emit the light. However, in an actual working process, although the thin-film transistor 20' corresponding to the second light emitting unit B is closed when the first light emitting unit A emits the light, it is found by the inventor in research that since the first auxiliary functional structure 14' between the anode 11' and the light emitting structure 13' is of an entire-surface structure, a current, i.e. a transverse current, flowing along an extension direction of the organic light emitting display panel may be generated therein (a direction of a single-direction arrow in FIG. 1 indicates the flowing direction of the transverse current). Under the action of the transverse current, the light emitting structure 13' of the light emitting unit (such as the second light emitting unit B) disposed nearby the first light emitting unit A may also be excited to emit light, resulting in the signal crosstalk phenomenon between nearby light emitting units therefore abnormal display of the organic light emitting display panel occur.

Figure 2:
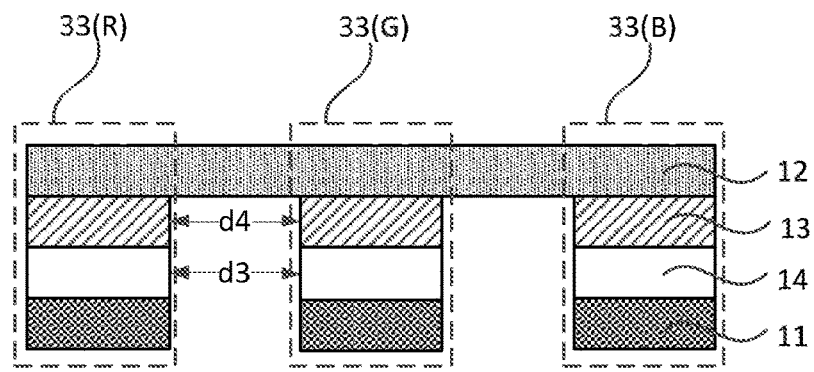
FIG. 2 illustrates a cross sectional structure of a number of partial film layers of an organic light emitting display panel according to one embodiment of the present disclosure.

FIG. 2 is a structural schematic diagram illustrating partial film layers of an organic light emitting display panel provided by embodiments of the present disclosure. Referring to FIG. 2, the organic light emitting display panel includes a plurality of light emitting units 33 (exemplarily including only three light emitting units in FIG. 2), and the light emitting unit 33 includes the anode 11, the first auxiliary functional structure 14, the light emitting structure 13 and the cathode 12, which are successively laminated. The first auxiliary functional structures 14 of different light emitting units are arranged separate from one another, the anodes 11 of different light emitting units are arranged separate from one another and the light emitting structures 13 of different light emitting units are arranged separate from one another.

The discrete arrangement of the first auxiliary functional structures 14, the anodes 11 and the light emitting structures 13 of different light emitting units 33 means that the first auxiliary functional structures 14 of different light emitting units 33 are separated from each other at a set distance, the anodes 11 of different light emitting units are separated from each other at a set distance, and the light emitting structures 13 of different light emitting units 33 are separated from each other at a set distance. In other words, the first auxiliary functional structures 14 of different light emitting units 33 are separated from each other at a set distance, which substantially means that the first auxiliary functional structures 14 of different light emitting units are disconnected to each other. In this way, there is no transverse current flowing along the extension direction of the organic light emitting display panel in the first auxiliary functional structure 14 when the image is displayed. Therefore, when any light emitting unit is driven by the drive circuit to emit the light, the signal crosstalk phenomenon will not occur in other light emitting units adjacent to light emitting unit.

Therefore, in embodiments of the present disclosure, the first auxiliary functional structures of different light emitting units are discretely arranged, the anodes of different light emitting units are discretely arranged and the light emitting structures of different light emitting units are discretely arranged, so that the problem that the existing organic light emitting display panel cannot display normally due to the signal crosstalk phenomenon caused by the transverse current generated in the organic light emitting display panel is solved, the transverse current is prevented from being generated in the organic light emitting display panel and the organic light emitting display panel is ensured to normally display the image.

For any of the light emitting units 33, a principle of exciting the light emitting structure 13 thereof to emit the light is as follows: after a drive signal is received by the cathode 12 and the anode 11 of the light emitting units 33 respectively, holes break through an interface energy barrier to be injected from the anode 11 and migrate towards the light emitting structure 13 through the first auxiliary functional structure 14; and electrons break through the interface energy barrier to be injected from the cathode 12 and migrate towards the light emitting structure 13. In the light emitting structure 13, the electrons and the holes are recombined to generate excitons, which are unstable and energy can be released from the recombination process. The energy released is transferred to molecules of an organic light emitting substance in the light emitting structure 13 to excite the molecules from a ground state to an excited state. The excited state can be unstable, so that the excited molecules are relaxed back to the ground state from the excited state to cause a radiative transition, thereby producing the photons.

In concrete manufacturing, optionally, the first auxiliary functional structure 14 includes at least one of a hole transporting layer and an electron blocking layer. The hole transporting layer is configured to promote the holes generated by the anode 11 to be transported to the light emitting structure 13, so that the holes are recombined with the electrons to generate the excitons, thereby enabling the organic light emitting display panel to emit the light. The electron blocking layer is configured to block the electrons transported from the cathode 12 from further moving towards the anode 11 after passing through the light emitting structure 13, so that a region where the holes and the electrons are recombined in the organic light emitting display panel is limited in the light emitting structure 13. Further, in order to promote the transportation of the holes, the first auxiliary functional structure 14 is optionally made of a P-type material, i.e. a hole-type material.

Optionally, the light emitting unit 33 includes a light emitting unit R for emitting a red light, a light emitting unit G for emitting a green light and a light emitting unit B for emitting a blue light. The light emitting structure 13 in the light emitting unit 33 includes at least one host material and at least one guest dopant material. Further, since the P-type material, i.e. the hole-type material, facilitates the transportation of the holes, and the N-type material, i.e. an electron-type material, facilitates the transportation of the electrons, the light emitting structure 13 can be configured to include two types of host material, i.e. the P-type material and the N-type material. Thus, the concentration of the holes and the electrons at the light emitting structure 13 can be facilitated, and the recombining efficiency of the electrons and the holes can be improved. Furthermore, in order to reduce an interface barrier between the first auxiliary functional structure 14 and the light emitting structure 13 and improve the transporting efficiency of the holes, the first auxiliary functional structure 14 and the light emitting structure 13 optionally are made of the same P-type material.

Those skilled in the art shall appreciate that the content of the host material in the light emitting material layer is greater than that of the guest dopant material in the light emitting material layer. Optionally, the mass percent of the guest dopant material in the light emitting material layer is 1% to 15%. Furthermore, the guest dopant material as a light emitting material may include a phosphorescent or fluorescent material. For example, the light emitting structure 13 corresponding to the light emitting unit R for emitting the red light and the light emitting structure 13 corresponding to the light emitting unit G for emitting the green light have the phosphorescent material as the guest dopant material, and the light emitting structure 13 corresponding to the light emitting unit B for emitting the blue light has the fluorescent material as the guest dopant material.

Further, in order to reduce the power consumption of the organic light emitting display panel, a guest dopant material with well light emitting performance may be selected in the light emitting structure 13. Optionally, an appropriate guest dopant material is selected, so that the current efficiency of the light emitting unit R for emitting the red light is greater than 30 cd/A, the current efficiency of the light emitting unit G for emitting the green light is greater than 100 cd/A, and the external quantum efficiency of the light emitting unit B for emitting the blue light is greater than 10% when the luminance is 1000 cd/m$^2$.

In the organic light emitting display panel, multiple film layers between the anode 11 and the cathode 12 form a micro-cavity structure. The refractive index of various film layers between the anode 11 and the cathode 12 is discontinuous across the layer boundaries in the micro-cavity structure. As the emitted light from the light emitting structure 13 hits the layer boundaries having discontinuous refractive index, it goes through reflection, total reflection, diffraction, or scattering, interference, at the interfaces. Certain light within a very narrow wavelength range is trapped inside the micro-cavity structure. One can design a resonate cavity of an effective length to have optimized thickness of each layer in the cavity, a light emitting center is formed nearby an antinode of a standing wave field in the cavity. Thus, the coupling efficiency of optical radiation from a source device can get resonated by the cavity, thereby improving the light emitting efficiency and the brightness of the device. Furthermore, since are, the light emitting units for emitting light in different colors need to be made with different micro-cavity lengths to accommodate different wavelengths of red, green and blue. Therefore, the thickness of the first auxiliary functional structure 14 corresponding to the light emitting unit R for emitting the red light is greater than or equal to 700 Å and less than or equal to 1100 Å; the thickness of the first auxiliary functional structure 14 corresponding to the light emitting unit G for emitting the green light is greater than or equal to 200 Å and less than or equal to 400 Å; and the thickness of the first auxiliary functional structure 14 corresponding to the light emitting unit B for emitting the blue light is greater than or equal to 100 Å and less than or equal to 300 Å.

Further referring to FIG. 2, in concrete manufacture, a distance d4 between the light emitting structures 13 of different light emitting units 33 and a distance d3 between different first auxiliary functional structures 14 of different light emitting units may be or may not be equal.

If the distance d4 between the light emitting structures 13 of different light emitting units 33 is equal to the distance d3 between the first auxiliary functional structures 14 of different light emitting units 33, it means that projections of the light emitting structure 13 and the first auxiliary functional structure 14 of the same light emitting unit 33 on the substrate of the organic light emitting display panel are completely overlapped. Optionally, the light emitting structure 13 and the first auxiliary functional structure 14 of the same light emitting unit 33 are formed through evaporation with a same mask when such organic light emitting display panel is manufactured.

Those skilled in the art may appreciate that, in the existing organic light emitting display panel, since the light emitting units are configured to emitting light in different colors, the first auxiliary functional structures 14 in the light emitting units for emitting light in different colors are generally necessary to be configured to have different thicknesses and the light emitting structures 13 in the light emitting units for emitting light in different colors are generally necessary to be configured to have different thicknesses so as to enable the light emitting unit 33 to have good light emitting efficiency. In this way, if the organic light emitting display panel includes the light emitting units 33 for emitting light in three colors, it is necessary to respectively manufacture three first auxiliary functional structures 14 of different thicknesses with three masks firstly and then respectively manufacture the light emitting structures 13 of different thicknesses with another three masks. That is, six masks are needed for manufacturing the first auxiliary functional structures 14 and the light emitting structures 13 when the existing organic light emitting display panel is manufactured.

In the technical solution of the present disclosure, if the distance d4 between the light emitting structures 13 of different light emitting units 33 is equal to the distance d3 between the first auxiliary functional structures 14 of different light emitting units 33, the light emitting structure 13 and the first auxiliary functional structure 14 of the same light emitting unit 33 can be formed through evaporation with the same mask. In concrete manufacture, three masks are needed, among which the first mask is used for manufacturing the light emitting structure 13 and the first auxiliary functional structure 14 of the red light emitting unit R, the second mask is used for manufacturing the light emitting structure 13 and the first auxiliary functional structure 14 of the green light emitting unit G, and the third mask is used for manufacturing the light emitting structure 13 and the first auxiliary functional structure 14 of the blue light emitting unit B. Therefore, the above-mentioned technical solution of the present disclosure can reduce the number of the masks required for manufacturing the organic light emitting display panel, thereby decreasing the manufacturing cost of the organic light emitting display panel.

Furthermore, it should be noted that in actual manufacture, prior to performing the evaporation with the mask, the mask shall be precisely aligned to the organic light emitting display panel. In actual operation, the precise alignment of the mask and the organic light emitting display panel generally takes more than 40 minutes. The time required for performing the evaporation with the mask is far less than that required by the precise alignment of the mask and the organic light emitting display panel, and is generally tens of seconds. Therefore, in actual production, the more the masks are needed for manufacturing the organic light emitting display panel, the longer the production period of the organic light emitting display panel is. The above-mentioned technical solution of the present disclosure can further shorten the manufacturing period of the organic light emitting display panel on the basis of reducing the number of the masks required for manufacturing the organic light emitting display panel.

Figure 3:
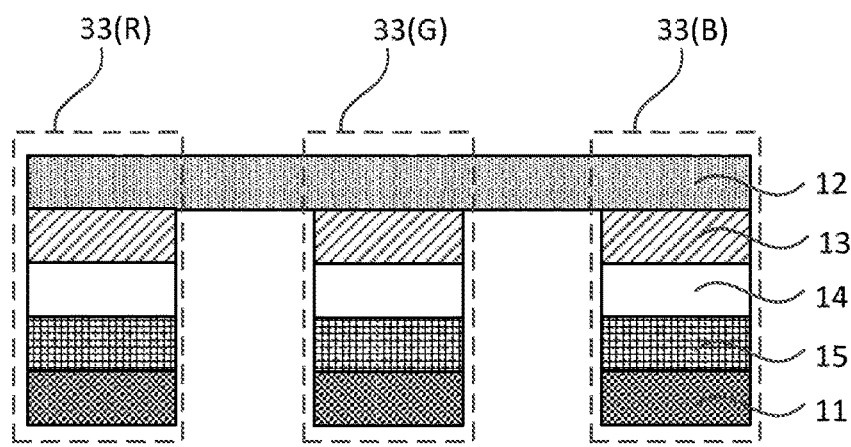
FIG. 3 illustrates a cross sectional structure of a number of partial film layers of an organic light emitting display panel according to one embodiment of the present disclosure.

FIG. 3 is a structural schematic diagram illustrating partial film layers of another organic light emitting display panel provided by embodiments of the present disclosure. Compared with FIG. 2, the organic light emitting display panel further includes a second auxiliary functional structure 15 in FIG. 3. Referring to FIG. 3, the second auxiliary functional structure 15 is disposed between the anode 11 and the first auxiliary functional structure 14. The second auxiliary functional structure 15 may include a hole injection layer. The hole injection layer is configured to decrease the interface barrier between the anode 11 and the first auxiliary functional structure 14, and improve the hole injection capacity. Optionally, the thickness of the hole injection layer is greater than or equal to 800 Å and less than or equal to 1000 Å. The hole injection layer may be a single-layer film structure and may also be a multilayer film structure. The material of each film layer forming the hole injection layer may be a single material, and may also be a mixture of multiple materials.

Further, the second auxiliary functional structure 15 may further include a buffer layer between the hole injection layer and the anode 11. In actual manufacture, the buffer layer may include at least one host material and at least one guest dopant material. On this basis, optionally, the host material of the buffer layer is the same as the host material of the hole injection layer, and the guest dopant material of the buffer layer includes a P-type material. The advantage of such arrangement is that the interface barrier between the buffer layer and the hole injection layer can be decreased. Optionally, the volume percent of the P-type material and the host material in the buffer layer together is greater than or equal to 0.5% and less than or equal to 10%. The thickness of the buffer layer may be greater than or equal to 50 Å and less than or equal to 100 Å.

Figure 4:
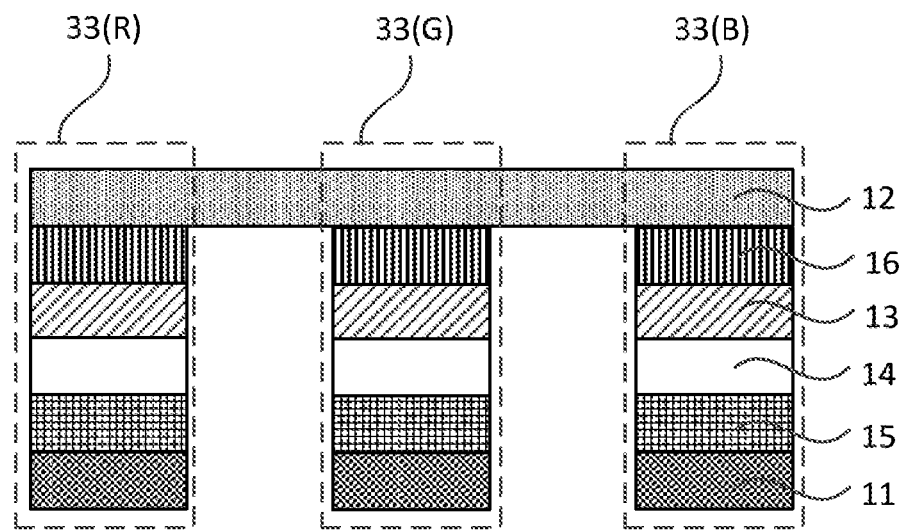
FIG. 4 illustrates a cross sectional structure of a number of partial film layers of yet another organic light emitting display panel according to an embodiment of the present disclosure.

FIG. 4 is a structural schematic diagram illustrating partial film layers of yet another embodiment of organic light emitting display panel in the present disclosure. Compared with FIG. 3, the organic light emitting display panel further includes a third auxiliary functional structure 16 in FIG. 4. Referring to FIG. 4, the third auxiliary functional structure 16 is disposed between the light emitting structure 13 and the cathode 12, and the third auxiliary functional structure 16 includes at least one of hole blocking layers and a first electron transporting layer. The hole blocking layer is configured to block holes transported from the anode 11 from further moving towards the cathode 12 after passing through the light emitting structure 13, so that a region where the holes and the electrons are recombined in the organic light emitting display panel is confined in the light emitting structure 13. The first electron transporting layer is configured to transport electrons generated by the cathode 12 to the light emitting structure 13, so that the holes and the electrons are recombined to generate excitons, thereby enabling the organic light emitting display panel to emit the light.

Optionally, as shown in FIG. 4, the third auxiliary functional structures 16 of different light emitting units are discretely arranged. Further, the light emitting structure 13, the first auxiliary functional structure 14 and the third auxiliary functional structure 16 of the same light emitting unit 33 are formed through evaporation with a same mask. The advantage of such manufacture is that the number of the masks required for manufacturing the organic light emitting display panel can be reduced, thereby decreasing the manufacturing cost of the organic light emitting display panel, and shortening the manufacturing period of the organic light emitting display panel.

In concrete setting, optionally, the material of the third auxiliary functional structure 16 includes a N-type material. The thickness of the third auxiliary functional structure 16 may be 200 Å to 400 Å. It should be noted that, the third auxiliary functional structure 16 and the light emitting structure 13 are optionally configured to be made of the same N-type material in the case that the material of the third auxiliary functional structure 16 includes the N-type material, so as to reduce an interface barrier between the third auxiliary functional structure 16 and the light emitting structure 13 and improve the transporting efficiency of the electrons.

Figure 5:
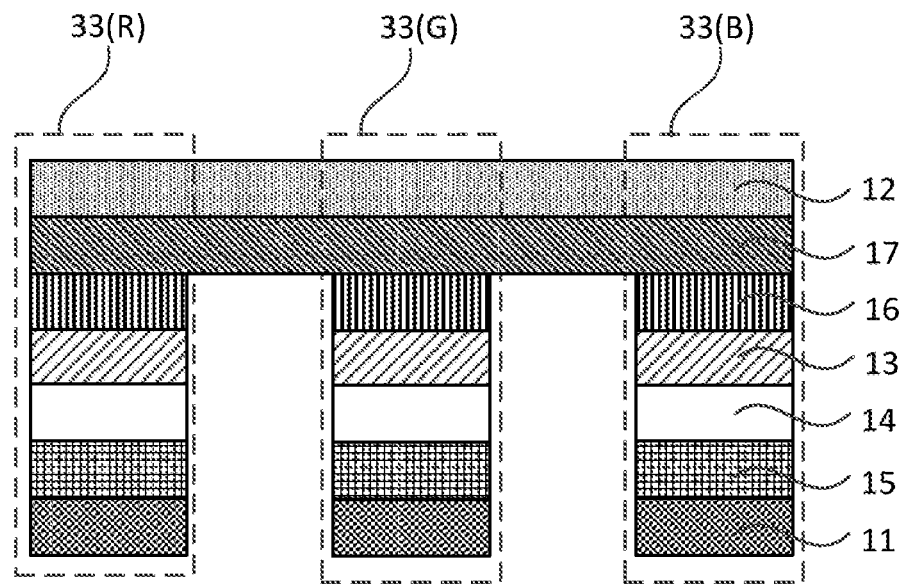
FIG. 5 illustrates a cross sectional structure of a number of partial film layers of yet another organic light emitting display panel according to an embodiment of the present disclosure.

FIG. 5 is a structural schematic diagram illustrating partial film layers of yet another organic light emitting display panel provided by embodiments of the present disclosure. As shown in FIG. 5, optionally, the organic light emitting display panel may further include a second electron transporting layer 17. The second electron transporting layer 17 is disposed between the third auxiliary functional layer 16 and the cathode 12. Optionally, the second electron transporting layers 17 of different light emitting units 33 can be configured as an entire-surface structure.

Further, the second electron transporting layer 17 and/or the first electron transporting layer can be doped with a lithium complex or a metal material, which can facilitate the injection and transportation of the electrons.

In the above-mentioned technical solution, optionally, the anode 11 and/or the cathode 12 may be used as the electrode at an emergent light side of the organic light emitting display panel. If only the anode 11 is the emergent light side electrode of the organic light emitting display panel or only the cathode 12 is the emergent light side electrode of the organic light emitting display panel, the organic light emitting display panel is a single-side light-emitting organic light emitting display panel. If both the anode 11 and the cathode 12 are the emergent light side electrodes of the organic light emitting display panel, the organic light emitting display panel is a double-side light-emitting organic light emitting display panel. Typical examples are described in detail below.

Figure 6:
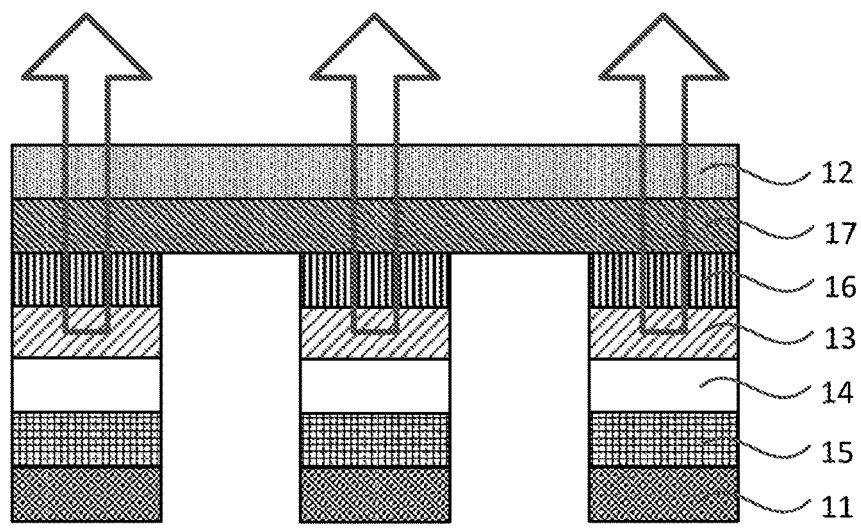
FIG. 6 illustrates a cross sectional structure of a number of partial film layers of yet another organic light emitting display panel according to an embodiment of the present disclosure.

FIG. 6 is a structural schematic diagram illustrating partial film layers of yet another organic light emitting display panel provided by embodiments of the present disclosure. Referring to FIG. 6, only the cathode 12 is used as the emergent light side electrode in the organic light emitting display panel, that is, the light is radiated from the cathode 12 after being formed at the light emitting structure 13. Specifically, the anode 11 may include two or more functional layers, in which at least one functional layer is a film layer with a reflection function. For example, the anode 11 includes a first conductive transparent film, a second conductive transparent film and a reflection film disposed between the first conductive transparent film and the second conductive transparent film. In concrete design, the material and the thickness of each film layer in the anode 11 may be various as long as the anode 11 can be ensured to have better hole injection capacity and better reflection effect. Optionally, the material of the first conductive transparent film and the second conductive transparent film in the anode 11 may be indium tin oxide, indium zinc oxide or a mixture of aluminum oxide and zinc oxide, the material of the reflection film may be silver or silver-containing alloy, and the thickness of the reflection film may be 50 nm to 150 nm. The material of the emergent light side electrode (cathode 12) may be silver or silver-containing alloy, such as magnesium-silver alloy, metal silver, silver-ytterbium alloy or silver rare-earth metal alloy. The thickness of the emergent light side electrode (cathode 12) may be various as long as the emergent light side electrode (cathode 12) can be ensured to have good electron injection capacity and high light transmittance. For example, the material of the emergent light side electrode (cathode 12) may be silver-containing alloy, in which the volume percent of the silver is greater than or equal to 80%, and the thickness of the emergent light side electrode (cathode 12) may be 10 nm to 20 nm. Based on this, in order to enable the organic light emitting display panel to have better display effect, optionally, the transmittance of the emergent light side electrode (cathode 12) at the light with a wavelength of 550 nm is greater than or equal to 20% and less than or equal to 50%.

Figure 7:
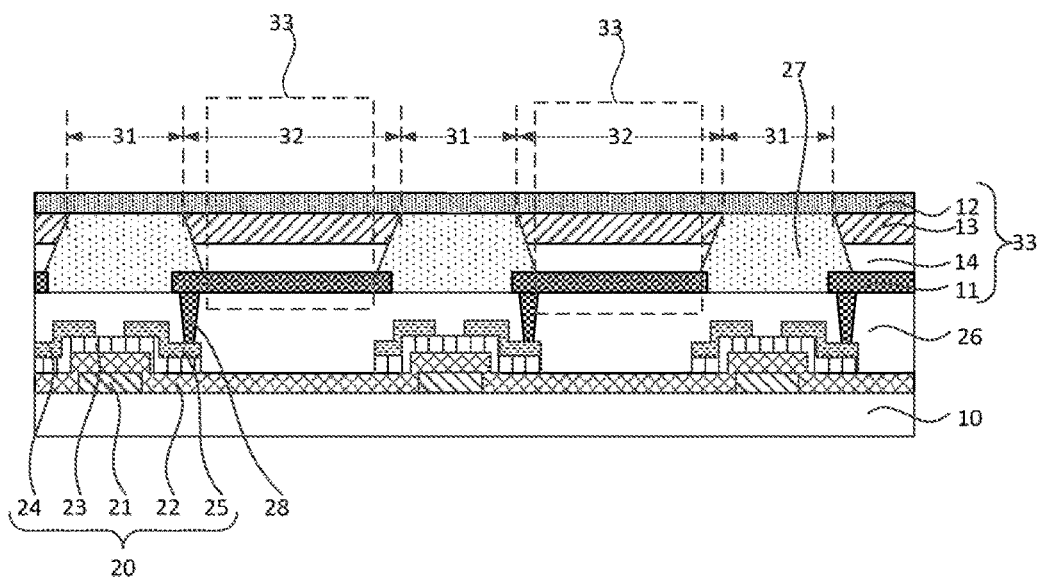
FIG. 7 illustrates a cross sectional structure in an organic light emitting display panel according to the present disclosure.

FIG. 7 is a structural schematic diagram illustrating an organic light emitting display panel provided by embodiments of the present disclosure. Referring to FIG. 7, the organic light emitting display panel includes a substrate 10. The substrate 10 is divided into a plurality of pixel regions 32 and non-pixel regions 31, and the pixel regions 32 and the non-pixel regions 31 are arranged alternatively.

The non-pixel region 31 includes a thin-film transistor 20 formed on the substrate 10 and a pixel limiting layer 27 formed at a side, away from the substrate 10, of the thin-film transistor 20. The pixel region 32 includes a plurality of light emitting units 33. The light emitting unit 33 is the light emitting unit provided in the aforementioned technical solutions. The light emitting unit 33 includes an anode 11, a first auxiliary functional structure 14, a light emitting structure 13 and a cathode 12, which are successively laminated. The first auxiliary functional structures 14 of different light emitting units are arranged discretely, the anodes 11 of different light emitting units are arranged discretely and the light emitting structures 13 of different light emitting units are arranged discretely.

Further referring to FIG. 7, the thin-film transistor 20 may include a gate 21, a gate insulation layer 22, an active layer 23, a source electrode 24 and a drain electrode 25. The thin-film transistor 20 may be a thin-film transistor of a bottom-gate structure (that is, the gate 21 is disposed between the substrate 10 and the active layer 23), and may also be a thin-film transistor of a top-gate structure (that is, the active layer 23 is disposed between the substrate 10 and the gate 21). Exemplarily, in FIG. 7, the thin-film transistor 20 is the thin-film transistor of the bottom-gate structure, the active layer 23 is formed above the gate 21, i.e., the gate 21 is disposed between the substrate 10 and the active layer 23. The gate 21 may be formed on the substrate 10 and has electrical conductivity. The gate insulation layer 22 may be formed on the gate 21 and covers the gate 21. The gate insulation layer 22 enables the gate 21 to be insulated from the active layer 23. The active layer 23 may be formed on the gate insulation layer 22. The active layer 23 may correspond to the gate 21, for example, the active layer 23 is overlapped with the gate 21. The active layer 13 may include a source region and a drain region doped with N-type or P-type impurities and a channel region for connecting the source region and the drain region. Generally speaking, the source region and the drain region are respectively formed at two ends of the active layer 23, while the channel region is formed in the middle portion of the active layer 23. The active layer 23 may include a semiconductor material. The source electrode 24 and the drain electrode 25 are formed on the active layer 23. The source electrode 24 and the drain electrode 25 may be separated from each other, and can be electrically connected with each other by virtue of the active layer 23 served as a channel The source electrode 24 and the drain electrode 25 can be respectively electrically connected to the source region and the drain region of the active layer 23. Both the source electrode 24 and the drain electrode 25 have electrical conductivity.

The organic light emitting display panel further includes a flattened layer 26, and the flattened layer 26 may be formed on the entire substrate 10. The pixel light emitting unit 33 is formed on the flattened layer 26 corresponding to the pixel region 32, and the pixel limiting layer 27 is formed on the flattened layer 26 corresponding to the non-pixel region 31.

A plurality of through holes 28 are formed in the flattened layer 26, and the drain electrode 25 of the thin-film transistor 20 is electrically connected with the anode 11 of the pixel light emitting unit 33 disposed in the pixel region 32 through the through holes 28. Optionally, as shown in FIG. 7, in the pixel light emitting unit 33, the anode 11 is formed on the flattened layer 26 corresponding to the pixel region 32, and two adjacent pixel limiting layers 27 enable at least part of the anode 11 disposed in the pixel region 32 to be exposed. The cathode 12 covers the pixel region 32 and the non-pixel region 31. Apparently, the organic light emitting display panel further includes parts required for implementing the display (not shown in FIG. 1), such as data lines and scan lines, which are not described in more detail herein.

Figure 8:
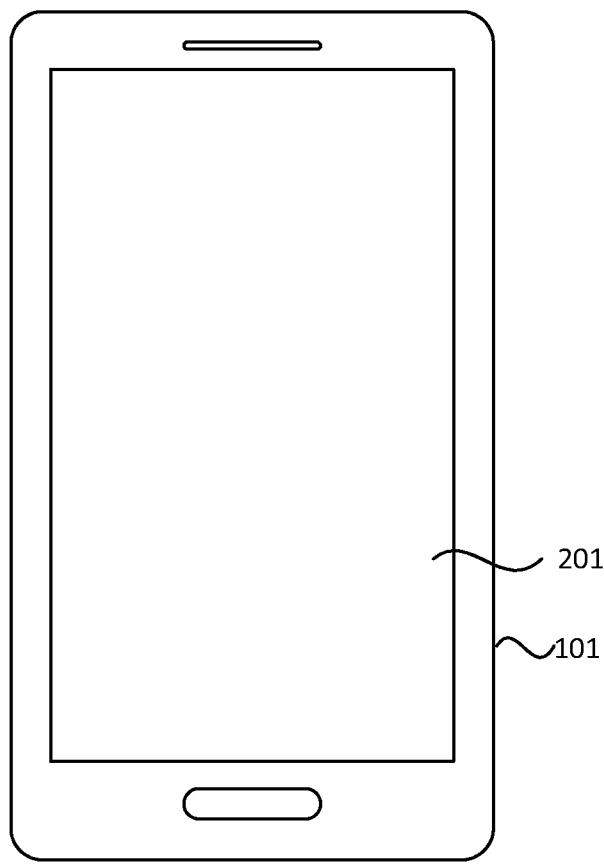
FIG. 8 is a schematic diagram illustrating an organic light emitting display apparatus provided by an embodiment of the present disclosure.

Based on a same disclosure concept, embodiments of the present disclosure further provide an organic light emitting display apparatus. FIG. 8 is a structural schematic diagram illustrating an organic light emitting display apparatus provided by embodiments of the present disclosure. Referring to FIG. 8, the organic light emitting display apparatus 101 includes an organic light emitting display panel 201 provided by any embodiments of the present disclosure. Specifically, the organic light emitting display apparatus may be a mobile phone, a notebook computer, a smart wearable device, an information query machine in a public hall, and the like.

According to the organic light emitting display apparatus provided by embodiments of the present disclosure, the first auxiliary functional structures, the anodes and the light emitting structures of different light emitting units in the organic light emitting display panel in the organic light emitting display apparatus are respectively arranged discretely, so that the problem that the existing organic light emitting display panel cannot normally display due to the signal crosstalk phenomenon caused by the transverse current generated in the organic light emitting display panel is solved, the transverse current is prevented from being generated in the organic light emitting display panel and the normal image display of the organic light emitting display panel is ensured.

Figure 9:
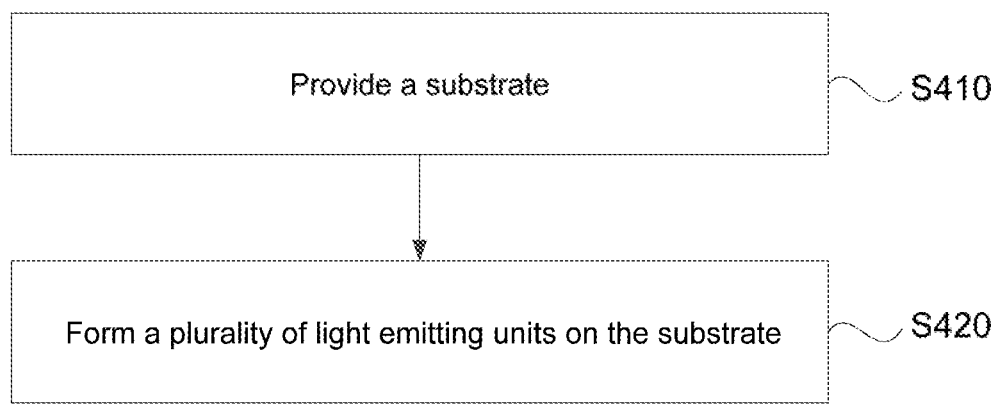
FIG. 9 is a flow chart illustrating a method for manufacturing an organic light emitting display apparatus according to embodiments of the present disclosure.

Based on a same disclosure concept, embodiments of the present disclosure further provide a method for manufacturing an organic light emitting display panel. FIG. 9 is a flow chart illustrating a method for manufacturing an organic light emitting display panel provided by embodiments of the present disclosure. Referring to FIG. 9, the method for manufacturing the organic light emitting display panel includes the following steps:

in S410, a substrate is provided;

in S420, a plurality of light emitting units are formed on the substrate, where the light emitting unit includes an anode, a first auxiliary functional structure, a light emitting structure and a cathode, which are successively laminated; and the first auxiliary functional structures of different light emitting units are arranged separate from one another, the anodes of different light emitting units are arranged separate from one another and the light emitting structures of different light emitting units are arranged separate from one another.

By arranging the first auxiliary functional structures, the anodes and the light emitting structures of different light emitting units separate from one another, the method for manufacturing the organic light emitting display panel provided by embodiments of the present disclosure solves the problem that the existing organic light emitting display panel cannot display normally because the working time (light emitting time) of each light emitting unit is liable to be disordered due to the transverse current generated in the organic light emitting display panel, and prevents the transverse current from being generated in the organic light emitting display panel and ensures the normal image display of the organic light emitting display panel.

In concrete manufacture, the first auxiliary functional structure may include at least one of the hole transporting layer and the electron blocking layer. The material of the first auxiliary functional structure may be the P-type material.

The light emitting units may include a light emitting unit for emitting the red light, a light emitting unit for emitting the green light and a light emitting unit for emitting the blue light. The light emitting structure may include at least one host material and at least one guest dopant material. Exemplarily, the light emitting structure may include two types of host material, i.e. the P-type material and the N-type material. Further, the thickness of the first auxiliary functional structure corresponding to the light emitting unit for emitting the red light is greater than or equal to 700 Å and less than or equal to 1100 Å; the thickness of the first auxiliary functional structure corresponding to the light emitting unit for emitting the green light is greater than or equal to 200 Å and less than or equal to 400 Å; and the thickness of the first auxiliary functional structure corresponding to the light emitting unit for emitting the blue light is greater than or equal to 100 Å and less than or equal to 300 Å.

Based on the above-mentioned technical solution, optionally, the first auxiliary functional structure and the light emitting structure of the same light emitting unit are formed through evaporation with the same mask. In concrete manufacture, three masks are needed, in which the first mask is used for manufacturing the light emitting structure and the first auxiliary functional structure of the red light emitting unit, the second mask is used for manufacturing the light emitting structure and the first auxiliary functional structure of the green light emitting unit, and the third mask is used for manufacturing the light emitting structure and the first auxiliary functional structure of the blue light emitting unit. Compared with the existing method for manufacturing the organic light emitting display panel, the number of the masks required for manufacturing the organic light emitting display panel can be reduced, thereby decreasing the manufacturing cost of the organic light emitting display panel, and shortening the manufacturing period of the organic light emitting display panel.

In manufacture, the organic light emitting display panel may be further configured to include a second auxiliary functional structure disposed between the anode and the first auxiliary functional structure. The second auxiliary functional structure may include a hole injection layer, and the thickness of the hole injection layer is greater than or equal to 800 Å and less than or equal to 1000 Å. The second auxiliary functional structure may further include a buffer layer disposed between the hole injection layer and the anode. The buffer layer may include at least one host material and at least one guest dopant material. Exemplarily, the host material of the buffer layer is the same as the host material of the hole injection layer, and the guest dopant material of the buffer layer includes the P-type material. Optionally, the volume percent of the P-type material and the host material in the buffer layer may be greater than or equal to 0.5% and less than or equal to 10%. The thickness of the buffer layer may be greater than or equal to 50 Å and less than or equal to 100 Å.

Further, in the manufacturing process, the organic light emitting display panel may be further configured to include a third auxiliary functional structure disposed between the light emitting structure and the cathode, and the third auxiliary functional structure includes at least one of a hole blocking layer and a first electron transporting layer.

Based on the above-mentioned technical solution, optionally, the third auxiliary functional structures of different light emitting units are arranged separate from one another, and the light emitting structure, the first auxiliary functional structure and the third auxiliary functional structure of the same light emitting unit are formed through evaporation with the same mask. In concrete manufacture, three masks are needed, in which the first mask is used for manufacturing the light emitting structure, the first auxiliary functional structure and the third auxiliary functional structure of the red light emitting unit, the second mask is used for manufacturing the light emitting structure, the first auxiliary functional structure and the third auxiliary functional structure of the green light emitting unit, and the third mask is used for manufacturing the light emitting structure, the first auxiliary functional structure and the third auxiliary functional structure of the blue light emitting unit. Compared with the existing method for manufacturing the organic light emitting display panel, the number of the masks required for manufacturing the organic light emitting display panel can be reduced, thereby decreasing the manufacturing cost of the organic light emitting display panel, and shortening the manufacturing period of the organic light emitting display panel.

Further, the material of the third auxiliary functional structure may include the N-type material. The thickness of the third auxiliary functional structure may be 200 Å to 400 Å.

It should be noted that the above are only preferred embodiments and applied technical principles of the present disclosure. Those skilled in the art should understand that the present disclosure is not limited to the specific embodiments described herein, and various apparent changes, readjustments and replacements can be made by those skilled in the art without departing from the protection scope of the present disclosure. Therefore, although the present disclosure is described in detail through the above embodiments, the present disclosure is not merely limited to the above embodiments; and more other equivalent embodiments can also be included without departing from the concept of the present disclosure, while the scope of the present disclosure is determined by the scope of the appended claims.

What is claimed is:

1. A method for manufacturing an organic light emitting display panel, comprising:
   providing a substrate; and
   forming a plurality of light emitting units on the substrate, wherein
   each of the light emitting units comprises an anode, a first auxiliary function structure, a light emitting structure, and a cathode, wherein the anode, the first auxiliary functional structure, the light emitting structure and the cathode are successively laminated,
   wherein the first auxiliary functional structures of different light emitting units are arranged separate from one another, the anodes of different light emitting units are arranged separate from one another, and the light emitting structures of different light emitting units are arranged separate from one another;
   wherein the plurality of light emitting units comprises a light emitting unit for emitting red light, a light emitting unit for emitting green light, and a light emitting unit for emitting blue light;
   wherein the thickness of the first auxiliary functional structure corresponding to the light emitting unit for emitting red light is greater than or equal to 700 Å and less than or equal to 1100 Å;
   wherein the thickness of the first auxiliary functional structure corresponding to the light emitting unit for emitting green light is greater than or equal to 200 Å and less than or equal to 400 Å; and
   wherein the thickness of the first auxiliary functional structure corresponding to the light emitting unit for emitting blue light is greater than or equal to 100 Å and less than or equal to 300 Å;
   wherein each of the plurality of light emitting units further comprises a third auxiliary functional structure, wherein the third auxiliary functional structure is disposed between the light emitting structure and the cathode, and wherein the third auxiliary functional structure comprises at least one of a hole blocking layer and a first electron transporting layer;
   wherein the third auxiliary functional structures of different light emitting units are arranged separated from each other; and
   wherein the light emitting structure, the first auxiliary functional structure and the third auxiliary function structure of the same light emitting unit are formed through evaporation with a same mask.

2. The method of claim 1, wherein the first auxiliary functional structure comprises at least one of a hole transporting layer and an electron blocking layer.

3. The method of claim 1, wherein the first auxiliary functional structure is made of a P-type material.

4. The method of claim 1, wherein the light emitting structure comprises at least one host material and at least one guest dopant material.

5. The method of claim 4, wherein the light emitting structure comprises two host materials that are respectively a P-type material and a N-type material.

6. The method of claim 1, further comprising a second auxiliary functional structure, wherein the second auxiliary functional structure is disposed between the anode and the first auxiliary functional structure.

7. The method of claim 6, wherein the second auxiliary functional structure comprises a hole injection layer; and
   the thickness of the hole injection layer is greater than or equal to 800 Å and less than or equal to 1000 Å.

8. The method of claim 7, wherein the second auxiliary functional structure further comprises a buffer layer, and wherein the buffer layer is disposed between the hole injection layer and the anode.

9. The method of claim 8, wherein the buffer layer comprises at least one host material and at least one guest dopant material.

10. The method of claim 9, wherein the host material of the buffer layer is the same as the host material of the hole injection layer, and wherein the guest dopant material of the buffer layer comprises a P-type material.

11. The method of claim 10, wherein a volume percent of the P-type material and the host material in the buffer layer is greater than or equal to 0.5% and less than or equal to 10% by volume.

12. The method of claim 8, wherein the thickness of the buffer layer is greater than or equal to 50 Å and less than or equal to 100 Å.

13. The method of claim 1, wherein the third auxiliary functional structure comprises a N-type material.

14. The method of claim 1, wherein the thickness of the third auxiliary functional structure is 200 Å to 400 Å.

* * * * *